United States Patent
Anderle

[11] Patent Number: 5,985,036
[45] Date of Patent: Nov. 16, 1999

[54] VACUUM COATING APPARATUS FOR OVERALL COATING OF A SUBSTRATE BY ROTATION OF THE SUBSTRATE IN A STREAM OF MATERIAL

[75] Inventor: Friedrich Anderle, Hanau, Germany

[73] Assignee: Leybold Systems GmbH, Hanau, Germany

[21] Appl. No.: 08/953,770

[22] Filed: Oct. 17, 1997

[30] Foreign Application Priority Data

Oct. 23, 1996 [DE] Germany .......................... 196 43 702

[51] Int. Cl.$^6$ .............................. C23C 14/00; C23C 14/50
[52] U.S. Cl. .............................. 118/729; 901/26; 901/43; 414/758; 414/783; 118/730
[58] Field of Search .............................. 118/729, 50, 730; 414/763, 758, 783, 936; 901/26, 43; 74/490.05, 490.06, 490.01; 269/61

[56] References Cited

U.S. PATENT DOCUMENTS

| | | |
|---|---|---|
| 4,657,472 | 4/1987 | Zimmer . |
| 4,736,645 | 4/1988 | Zimmer . |
| 4,771,652 | 9/1988 | Zimmer . |
| 4,854,808 | 8/1989 | Bruno . |
| 5,102,280 | 4/1992 | Poduje et al. . |
| 5,558,909 | 9/1996 | Poliquin et al. . |
| 5,759,268 | 6/1998 | Begin et al. . |
| 5,763,020 | 6/1998 | Yang . |

*Primary Examiner*—Robert J. Warden, Sr.
*Assistant Examiner*—Jennifer C. McNeil

[57] ABSTRACT

In a vacuum coating apparatus for an allover coating of a substrate by rotation of the substrate (3) in a stream of material, comprising a vacuum chamber with a material source (13), a substrate holder (6) with a point of attachment (19) for the holding of the substrate (3) in front of the material source (13) and a drive (10, 11, 21) provided for the substrate holder (6) for generating a rotating and shifting motion of the substrate (3), the substrate holder (6) is composed of three legs manufactured from hollow sections (7, 8, 9), disposed at angles to each other, where the first leg (7) and the second leg (8) form an obtuse angle ($\alpha$) and the second and third legs (8 and 9) form an approximately right-angle knee, and the substrate (3) is held at the end of the third leg (9), where the substrate holder (6) is rotatable about the longitudinal axis (1) of the first leg (7) by a motor drive and in addition is shiftable axially to and from along this longitudinal axis (1).

5 Claims, 1 Drawing Sheet

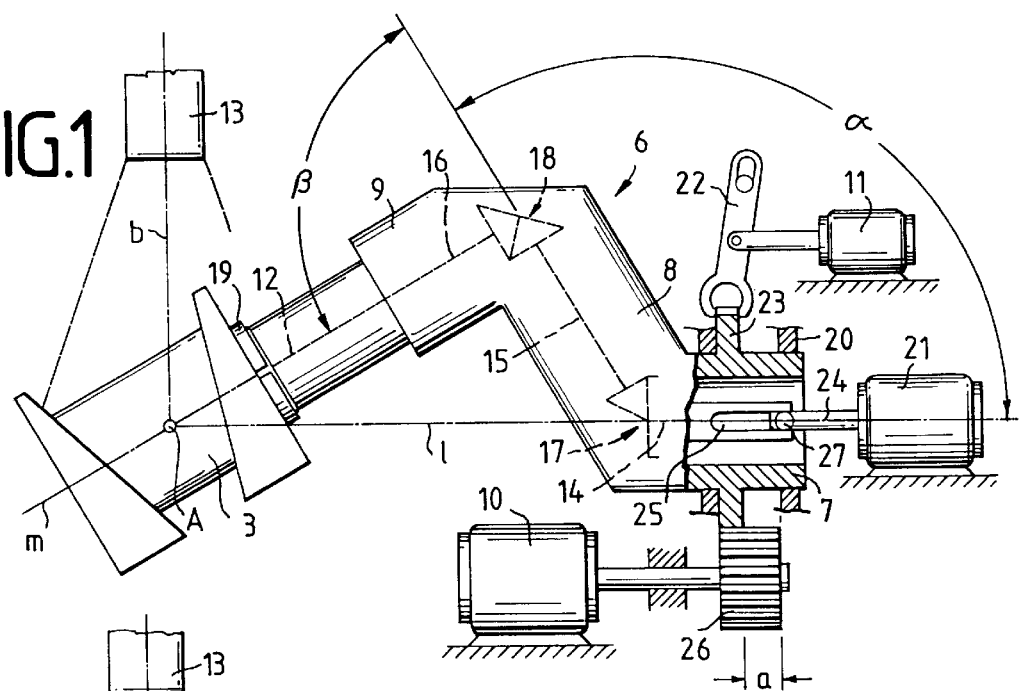
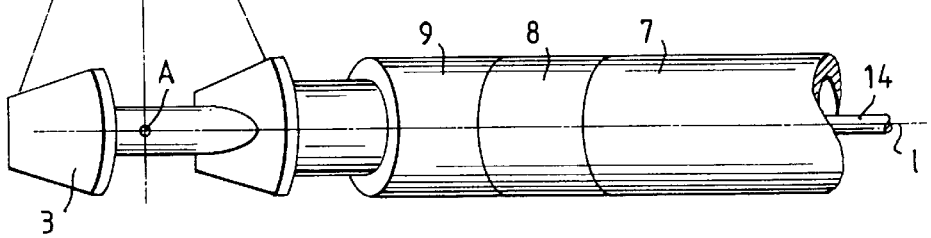
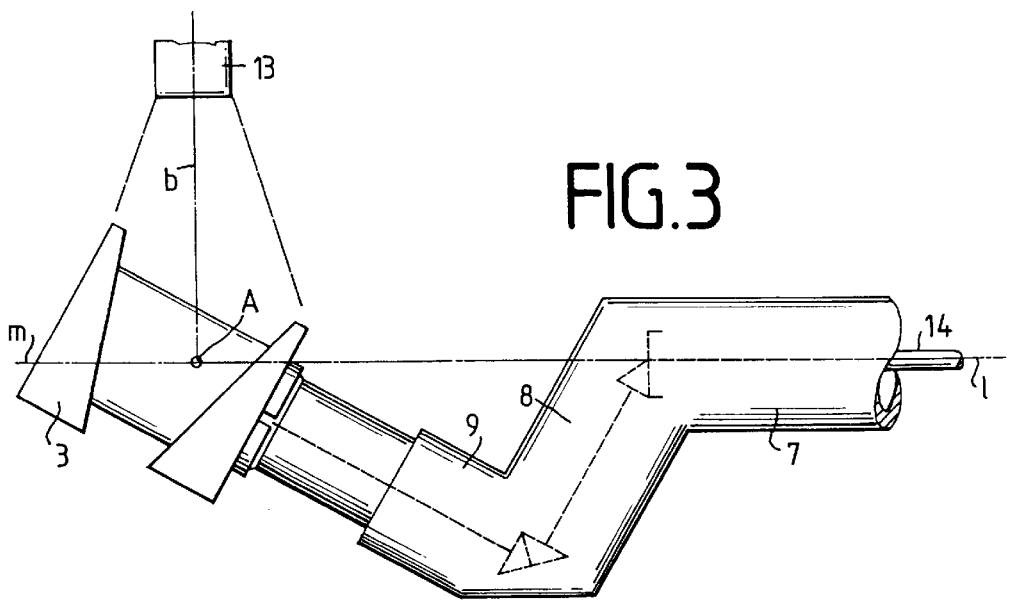

VACUUM COATING APPARATUS FOR OVERALL COATING OF A SUBSTRATE BY ROTATION OF THE SUBSTRATE IN A STREAM OF MATERIAL

FIELD OF THE INVENTION

The invention relates to a vacuum coating apparatus for an allover coating of a substrate by rotation of the substrate in a stream of material, comprising a vacuum chamber with a substrate holder for the positioning of a substrate in front of the material source and subject to substantially even distribution over its surface, and drives provided to create a swinging motion of the substrate holders.

Possible coating methods include vacuum vapor coating, cathode sputter method, ion plating, CVD method (Chemical Vapor Deposition) and related methods.

DESCRIPTION OF THE PRIOR ART

Coating of substrates with a thin surface layer on all sides is known, by means of exposing them to a rotating motion in a directed stream of material and/or by guiding them through the vapor while performing a rotating motion. For this purpose the substrates are individually placed on shafts and, while rotating about the shaft's axis, brought into the vapor stream. Rollers or gear wheels are provided at the shaft ends, rolling over a stationary rack or rail to drive the shaft. Resistor layers are currently applied to pipe insulators in the manner described above.

Also known is to attach geometrically simple substrates such as for example optical lenses and filters to substrate holders and to guide them periodically through a vapor stream while performing complex compound motions. Such apparatus or methods are only suitable for relatively small substrates whose shape does not itself pose any problems in respect to an even distribution of the layer thickness.

For the vapor coating of relatively complex parts such as for example headlight reflectors for motor vehicles it is known to arrange the substrates in substrate holders which are arranged rotatably in a substantially cylindrical cage. A vapor source is located in the interior of the cage so that when rotating the cage the substrates are moved by the upwardly directed vapor stream. Due to a combination drive the substrate holders perform within the cage an additional motion which can be described as an involute motion. Due to the law of chance a quite good distribution of the layer thickness is achieved by the above method. However, such an apparatus is not suitable for extremely irregularly shaped substrates of larger dimensions which are to be coated in batches with high-melting-point metals or alloys where the substrate temperature should be above for example 555° C.

An example of substrates of particularly complex geometric shapes, where in addition a high value is placed on an even layer thickness distribution, distribution of the alloy components in the layer and a high degree of adhesion through intermetallic diffusion, are turbine blades for gas turbines as used in aviation. Problems connected with surface layers in such turbine blades are described in "High Temperature Resistant Coatings for Super-Alloy" by Richard P. Seeling and Dr. Richard J. Stueber, published by Chromalloy American Corporation, New York. Until now it has been exceptionally difficult to manufacture on a large scale and at economically defensible prices such layers having the required properties. A particular problem here are the transfer of a defined rotational motion from a drive motor to a substrate as well as the relatively high losses of expensive vapor coating material which condenses instead of on the substrate on the inner surfaces of the coating apparatus and leads to trouble-causing deposits there. This problem can be countered to a certain extent by a spatially tight configuration of the substrate in the vapor stream or above the evaporating pot.

Finally, a vacuum coating apparatus is known for the allround coating of substrates by means of rotation of the substrate in a material stream (DE 28 13 180), comprising a vacuum chamber with an elongated material source, with a longitudinal axis and a transverse axis, with a substrate holder having a plurality of attachment sources for the two-dimensional arrangement of the source material, where the substrate holder has two parallel fork-type carrier arms whose longitudinal axes are arranged mirror-inverted relative to a vertical plane of symmetry passing through the longitudinal axis of the material source and where couplings for the substrates are provided on the inner sides of the carrier arms positioned pointing toward each other, where the rotational axes of the couplings are positioned vertical in relation to the plane of symmetry and an individual drive shaft is provided for each carrier arm's longitudinal axis, which drive shafts are connected via universal joints to the couplings on the one hand and a motor on the other hand.

SUMMARY OF THE INVENTION

The object of the invention is to provide a vacuum coating apparatus of the kind described in the preamble which would make it possible to coat a complex-shape substrate exceptionally uniformly with metallic surface coatings.

The object is attained according to the invention in that the substrate holder is formed from three legs of hollow sections extending at angles to each other, where the first leg forms an obtuse angle with the second leg and the second and third legs together form an approximately right-angle knee and the substrate is held at the end of the third leg, where the longitudinal axis of the first leg intersects approximately the central portion of the substrate, where the substrate holder is motor-driven and rotatable about the axis of the first leg and is additionally axially movable to and from in the direction of this axis, and where the substrate is rotationally fixed to a shaft which shaft is designed as a cardan shaft or a flexible shaft and extends, along the longitudinal axes of the legs, through the hollow sections, and where the shaft's free end can be driven by a motor.

Additional features and particulars are described in more detail and characterized in the subclaims.

BRIEF DESCRIPTION OF THE DRAWINGS

The invention permits a variety of embodiments; one is represented purely schematically in more detail in the accompanying drawing and shows in FIG. 1 a side view of the vacuum coating apparatus with a manipulator arm for the holding of a turbine blade, FIG. 2 the apparatus according to FIG. 1, but with the manipulator arm rotated 90°, and in FIG. 3 the apparatus according to FIGS. 1 and 2, but with the manipulator arm rotated an additional 90°.

DETAILED DESCRIPTION

A coating source 13 is arranged in a fixed manner within a coating apparatus not shown, which source is suitable to coat the substrate 3, in this case a turbine blade, with a wear and/or heat resistant layer. In order to ensure uniform coating, the substrate 3 is attached to a substrate holder 6 which holder is composed of three parts, or legs, 7, 8, 9, of which the first two legs 7, 8 form an obtuse angle α and the second and third legs 8 and 9 form a right angle β.

Legs 7, 8, 9 are designed as hollow sections and rigidly secured to one another or made from one piece. A multipart drive shaft 14, 15, 16 extends through the longitudinal hollows of the three legs 7, 8, 9, whose shaft's individual members are functionally linked by bevel gear pairs 17 or 18. The shaft 14 is driven by a motor 21 whose rotary motion is transferred through the multipart shaft 14, 15, 16 to the substrate 3 for which the substrate 3 is directly held by a collet chuck 19 at the free end of the shaft 12. Leg 7 is arranged rotatably on the stand 20 and can be rotated about axis 1 by a motor 10 which is why the substrate holder 6 is capable of arriving at the position shown in FIGS. 2 and 3. There is the additional possibility to shift the substrate holder 6 by a distance a parallel to the axis 1 whereby substrate 3 also changes its geometric center A by this distance a. To enable this shift parallel to axis 1, an actuator motor 11 is provided which motor by means of a rod moves the swingable lever 22. The lever's shift gate extends over a cam into slots 25 of the shaft 14 and is therefore functionally linked to the multipart shaft 14, 15, 16, which shaft transfers its motion to the substrate 3 which is held by chuck 19. Thus the substrate 3 can be shifted diagonally by a distance a in relation to the effective axis b of the stationary coating source 13 and be simultaneously rotated about axis m.

As shown by FIGS. 2 and 3, substrate 3 can be shifted and rotated in its position relative to coating source 13 so that all portions of the substrate's surface can be coated uniformly.

What is claimed is:

1. A vacuum coating apparatus for coating of a substrate substantially entirely by rotation of the substrate in a stream of material, said apparatus comprising:

a vacuum chamber having a material source;

a substrate holder in said vacuum chamber, said substrate holder having an attachment means for holding the substrate in front of the material source and drive means associated with the substrate holder for generating a rotating and shifting motion of the substrate;

the substrate holder being sectioned in first, second, and third legs made from hollow sections defining a passage therein, said legs extending at angles to each other, said first leg having a longitudinal axis;

the first leg and the second leg being connected with each other at an obtuse angle α;

the second and third legs being connected with each other so as to form an approximately right-angle knee;

the substrate attachment means being supported at an end of the third leg distal to said knee, said substrate attachment means being supported in a position wherein the longitudinal axis of the first leg intersects approximately a central portion of the substrate;

the substrate holder being supported so as to be rotatable about the longitudinal axis of the first leg, and in addition, being supported so as to be axially movable along said longitudinal axis; and the substrate attachment means being rotationally fixed to a shaft, said shaft being a cardan shaft or a flexible shaft and extending through the passage of the legs, said shaft having a free end functionally linked to a motor adapted to impart rotation to said shaft and said attachment means.

2. A vacuum coating apparatus according to claim 1 wherein the first leg is held and guided for rotational and shifting axial movement in a stationary bearing, and is provided with an at least partially cylindrical outer surface having a gearing structure thereon which gearing structure engages a pinion gear of a motor of the drive means.

3. A vacuum coating apparatus according to claim 1, wherein the end of the shaft proximal to said substrate includes a chuck for holding the substrate.

4. A vacuum coating apparatus according to claim 1, wherein the shaft is a flexible shaft, and the end of the flexible shaft distal to the substrate is rotationally connected to a drive shaft of the motor via a spline shaft.

5. A vacuum coating apparatus according to claim 1, wherein the drive means further comprises an actuator motor having a switch fork, said fork being movable by said motor and engaging the first leg so as to provide for reciprocating axial movement of said first leg and thereby said substrate holder.

* * * * *